United States Patent
Ma et al.

(10) Patent No.: US 9,899,071 B2
(45) Date of Patent: Feb. 20, 2018

(54) HEAVY METAL MULTILAYERS FOR SWITCHING OF MAGNETIC UNIT VIA ELECTRICAL CURRENT WITHOUT MAGNETIC FIELD, METHOD AND APPLICATIONS

(71) Applicant: THE JOHNS HOPKINS UNIVERSITY, Baltimore, MD (US)

(72) Inventors: Qinli Ma, Baltimore, MD (US); Yufan Li, Baltimore, MD (US); Chia-ling Chien, Cockeysville, MD (US)

(73) Assignee: THE JOHNS HOPKINS UNIVERSITY, Baltimore, MD (US)

( * ) Notice: Subject to any disclaimer, the term of this patent is extended or adjusted under 35 U.S.C. 154(b) by 0 days.

(21) Appl. No.: 15/411,082

(22) Filed: Jan. 20, 2017

(65) Prior Publication Data
US 2017/0229160 A1    Aug. 10, 2017

Related U.S. Application Data

(60) Provisional application No. 62/280,900, filed on Jan. 20, 2016.

(51) Int. Cl.
*G11C 11/16* (2006.01)
*H01L 43/10* (2006.01)
*H01L 43/08* (2006.01)
*H01L 43/12* (2006.01)

(52) U.S. Cl.
CPC ............ *G11C 11/161* (2013.01); *H01L 43/08* (2013.01); *H01L 43/10* (2013.01); *H01L 43/12* (2013.01)

(58) Field of Classification Search
CPC ..................................... G11C 11/161

USPC .......................................................... 365/158
See application file for complete search history.

(56) References Cited

U.S. PATENT DOCUMENTS

| | | | | |
|---|---|---|---|---|
| 8,247,093 B2* | 8/2012 | Rodmacq | ............... | B82Y 25/00 365/173 |
| 8,593,862 B2* | 11/2013 | Ranjan | ................... | B82Y 10/00 257/421 |
| 9,412,448 B2* | 8/2016 | Di Pendina | ......... | G11C 11/1675 |
| 9,520,443 B2* | 12/2016 | Khalili Amiri | ....... | H01L 27/224 |
| 9,564,152 B2* | 2/2017 | Ohno | ...................... | H01L 43/08 |
| 9,666,256 B1* | 5/2017 | Lai | ......................... | G11C 11/161 |

(Continued)

FOREIGN PATENT DOCUMENTS

CN        104393169 A        3/2015

OTHER PUBLICATIONS

Chiba, et al., Electrical control of the ferromagnetic phase transition in cobalt at room temperature. Nature Materials 2011, 10, 853-856.

(Continued)

*Primary Examiner* — Son Mai
(74) *Attorney, Agent, or Firm* — MH2 Technology Law Group LLP

(57) ABSTRACT

Provided is an electric-current-controllable magnetic unit, including: a substrate, an electric-current channel disposed on the substrate, the electric-current channel including a composite heavy-metal multilayer comprising at least one heavy-metal; a capping layer disposed over the electric-current channel; and at least one ferromagnetic layer disposed between the electric-current channel and the capping layer.

20 Claims, 7 Drawing Sheets

(56) References Cited

U.S. PATENT DOCUMENTS

| 2014/0340961 | A1* | 11/2014 | Ohno | H01L 43/08 |
|---|---|---|---|---|
| | | | | 365/158 |
| 2015/0036415 | A1* | 2/2015 | Di Pendina | G11C 11/18 |
| | | | | 365/148 |
| 2015/0200003 | A1* | 7/2015 | Buhrman | G11C 11/18 |
| | | | | 365/158 |
| 2016/0197263 | A1* | 7/2016 | Hu | H01L 43/02 |
| | | | | 365/158 |

OTHER PUBLICATIONS

Fukami, et al., A spin—orbit torque switching scheme with collinear magnetic easy axis and current configuration. Nature Nanotechnology 2016, 11, 621-625.

Safeer, et al., Spin—orbit torque magnetization switching controlled by geometry. Nature Nanotechnology 2016, 11, 143-146.

Yu, et al., Switching of perpendicular magnetization by spin—orbit torques in the absence of external magnetic fields. Nature Nanotechnology 2014, 9, 548-554.

Yu, et al., Room-Temperature Creation and Spin—Orbit Torque Manipulation of Skyrmions in Thin Films with Engineered Asymmetry. Nano Letters 2016, 16, 1981-1988.

* cited by examiner

HEAVY METAL MULTILAYERS FOR SWITCHING OF MAGNETIC UNIT VIA ELECTRICAL CURRENT WITHOUT MAGNETIC FIELD, METHOD AND APPLICATIONS

CROSS-REFERENCE TO RELATED APPLICATIONS

This application claims priority to U.S. Provisional Patent Application Ser. No. 62/280,900 filed Jan. 20, 2016, the entirety of which is incorporated herein by reference.

GOVERNMENT RIGHTS

This invention was made with government funds under Agreement No. HR0011-13-3-0002 awarded by The Defense Advanced Research Projects Agency (DARPA), Award Grant No. DE-SC0009390 awarded by the U.S. Department of Energy, Office of Science, Basic Energy Science, and Award Number. SC 0012670 awarded by the U.S. Department of Energy, Basic Energy Science. The U.S. Government has certain rights in this invention.

FIELD

This disclosure is generally directed to an electric-current-manipulated magnetic unit through spin-orbit torque, and a magneto-electronic device that includes the electric-current-controllable magnetic unit. The magnetic unit and the magneto-electronic devices find applications in non-volatile magnetic memory devices and magnetic tunnel junctions (MTJs), and in both cases, the electric-current used for manipulation does not pass through, but peripheral to, the structure.

BACKGROUND

Magnetization manipulation is the keystone for the magnetism based devices including traditional magnetic recording media and magneto-electronic devices, such as magnetic sensors, nonvolatile magnetic random access memories (MRAMs) and spin logic applications. In such devices, a magnetic layer is switched by a magnetic field. However, it is desirable to combine the nonvolatility of the magnetic bit with semiconductor microelectronics. Thus, the use of electric current, instead of magnetic field, to control magnetization is highly demanded.

Spin-transfer-torque (STT) was developed to switch the magnetization in a non-collinear magnetic system using spin-polarized current without the use of a magnetic field. For example, the racetrack memory and the STT-MRAM have been developed based on STT induced domain wall motion in magnetic nano-wires and the STT induced magnetization switch in giant magnetoresistance devices and magnetic tunnel junctions (MTJs), respectively. While STT based devices enjoy the benefit of site specific switching without magnetic field, the electrical current required to switch magnetization must passes through the device and must exceed a high threshold current density of greater than $10^7$ A/cm$^2$. This high value of current density is close to the breakdown limit of the devices, especially for MTJs. This drawback severely limits the viability of STT based devices.

To overcome the limitations described above, new technology has been proposed to utilize spin current generated from spin-orbit coupling (SOC) to manipulate the magnetic bit. A typical structure of such device comprise of Heavy-Metal/Ferromagnet bilayer. As an electric current passing through the Heavy-Metal, an effective torque will exert on the ferromagnetic layer, as so called spin-orbit torque (SOT). In this technique, the manipulation of the magnetic bit does not require high current density flowing in the FM layer, and therefore, promoted the lifetime and the reliability of the whole device. A shortcoming of such conventional techniques, however, is that they cannot manipulate a ferromagnetic layer with perpendicular magnetic anisotropy (PMA); i.e. its magnetic moments points in one of the two directions perpendicular to the film plane, without applying an in-plane magnetic field. While the PMA is generally considered necessary for achieving high recording density, the requirement of an external magnetic field is incompatible with microelectronics and magnetic storage. Such magnetic field requirement is undesirable and improved techniques. What is needed in the art, therefore, are improved devices and methods that avoid the limitations of conventional devices and methods.

SUMMARY

In an embodiment, there is an electric-current-controllable magnetic unit, comprising: a substrate, an electric-current channel disposed on the substrate, the electric-current channel comprising a composite heavy-metal multilayer comprising at least one heavy-metal; a capping layer disposed over the electric-current channel; and at least one ferromagnetic layer disposed between the electric-current channel and the capping layer.

In another embodiment, there is a method of making an electric-current-controllable magnetic unit, comprising: forming an electric-current channel comprising at least one layer on a substrate, the at least one layer comprising at least one heavy-metal; forming at least one ferromagnetic layer on the electric-current channel; and forming a capping layer on the at least one ferromagnetic layer.

In another embodiment, there is a method of making an electric-current-controllable magnetic unit, comprising: forming an electric-current channel comprising at least one layer on a substrate, the at least one layer comprising at least one heavy-metal; forming at least one ferromagnetic layer on the electric-current channel; and forming a capping layer on the at least one ferromagnetic layer; and forming a top metal layer on the capping layer comprising at least one heavy-metal.

In yet another embodiment there is a method of operating an electric-current-controllable magnetic unit, comprising: supplying an electric current to an electric-current-controllable magnetic unit, wherein the electric-current-controllable magnetic unit comprises: a substrate, an electric-current channel disposed on the substrate, the electric-current channel comprising a composite heavy-metal multilayer comprising at least one heavy-metal; a capping layer disposed over the electric-current channel; and at least one ferromagnetic layer disposed between the electric-current channel and the capping layer, wherein the electric current passes through the composite heavy-metal layer.

In yet another embodiment there is a method of operating an electric-current-controllable magnetic unit, comprising: supplying an electric current to an electric-current-controllable magnetic unit, wherein the electric-current-controllable magnetic unit comprises: a substrate, an electric-current channel disposed on the substrate, the electric-current channel comprising a composite heavy-metal multilayer comprising at least one heavy-metal; a capping layer disposed over the electric-current channel; and at least one ferromagnetic layer disposed between the electric-current channel and the capping layer; and a top metal layer comprising at least one heavy-metal on top of the capping layer, wherein the electric current passes through the composite heavy-metal layer and the top metal layer.

Advantages of at least one embodiment include devices and method that allow for SOT switching without magnetic field. Additional advantages of the embodiments will be set forth in part in the description which follows, and in part will be understood from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

BRIEF DESCRIPTION OF THE DRAWINGS

FIG. 5A shows switching electric density of a device of the embodiments as a function of thickness of a layer of the composite heavy-metal multilayer comprising a first heavy metal. FIG. 5B shows switching electric density of a device of the embodiments as a function of thickness of another layer of the composite heavy-metal multilayer comprising a second heavy metal different than the first heavy metal. FIGS. 5C-5D each shows switching of the magnetization by an electric current with assistance of an in-plane magnetic field for a device of an embodiment but having different thicknesses for first and second layers of the composite heavy-metal multilayer.

DETAILED DESCRIPTION OF THE EMBODIMENTS

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

The following embodiments are described for illustrative purposes only with reference to the Figures. Those of skill in the art will appreciate that the following description is exemplary in nature, and that various modifications to the parameters set forth herein could be made without departing from the scope of the present invention. It is intended that the specification and examples be considered as examples only. The various embodiments are not necessarily mutually exclusive, as some embodiments can be combined with one or more other embodiments to form new embodiments.

In embodiments of the present disclosure, devices and method that allow for SOT switching without magnetic field are provided. For example, by properly choosing two heavy metals (HM) with large SOC contrast (which manifests as opposite spin Hall angle), perpendicular magnetization switching using electric current alone without an external magnetic field or any more complicated nanostructure is realized. More specifically, embodiments described herein include select heavy metal multilayers provide for device operation to include SOT switching of electric in zero magnetic field.

The composite heavy-metal (composite HM) electric-current channel here refers to multilayers (bilayers, trilayers, multiple stacked layers, etc.) made of, for example, the above-mentioned two kinds of heavy metals, with each layer having appropriate individual thicknesses. While not limited to any particular device, composite heavy-metal multilayers of the embodiments can be incorporated in devices in order to provide for switching single PMA FM layers, such as those in racetrack memory as well as magnetoresistance devices and MTJs.

Figure 1A:
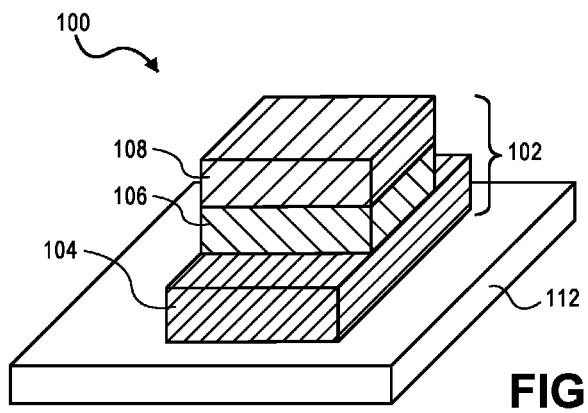
FIG. 1A is a cross-sectional view of a device of an embodiment, for example, an electric-current-controllable magnetic unit.
Figure 1B:
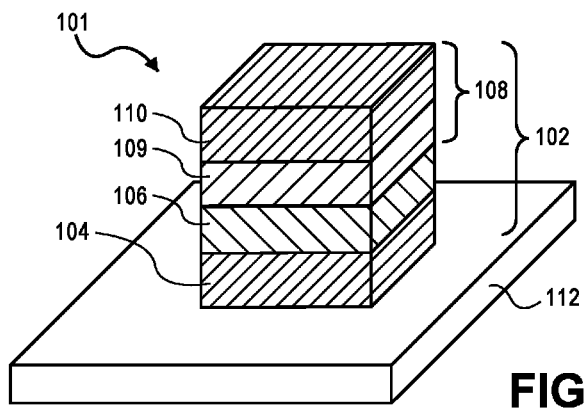
FIG. 1B is a cross-sectional view of a device of an embodiment, for example, an electric-current-controllable magnetic unit.
Figure 2:
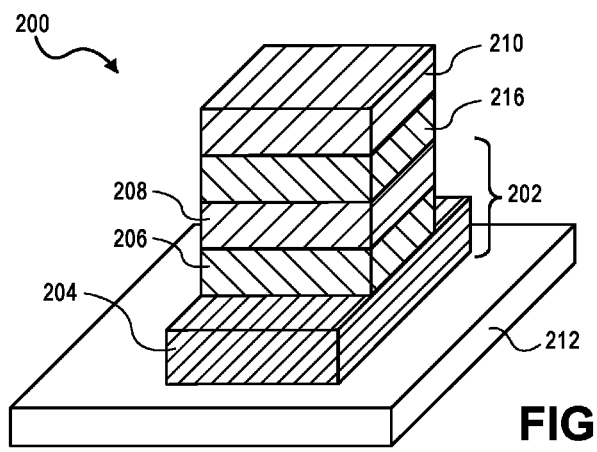
FIG. 2 is a cross-sectional view of a device of an embodiment, for example, an electric-current-controllable magneto-electronic device that includes an electric-current controllable magnetic unit.

FIGS. 1A-1B and FIG. 2 show exemplary device structures of the embodiments that, as described above, include heavy-metal multilayers adjacent to, for example, PMA ferromagnetic (FM) layer(s) such that the devices can be switched by SOT with zero external magnetic field.

Electric-Current-Controllable Magnetic Unit

An electric-current-controllable magnetic unit according to an embodiment of the present disclosure includes a composite heavy-metal (composite HM) multilayers as the electric current channel, and an adjacent ferromagnetic layer (FM) which acquires PMA. Over these layers, there can also be a composite capping layer (CC) necessary for acquiring the PMA and for protecting the structure from contamination and oxidation. An electric current passing through the composite HM multilayers causes SOT to switch the PMA FM layer.

Figure 3A:
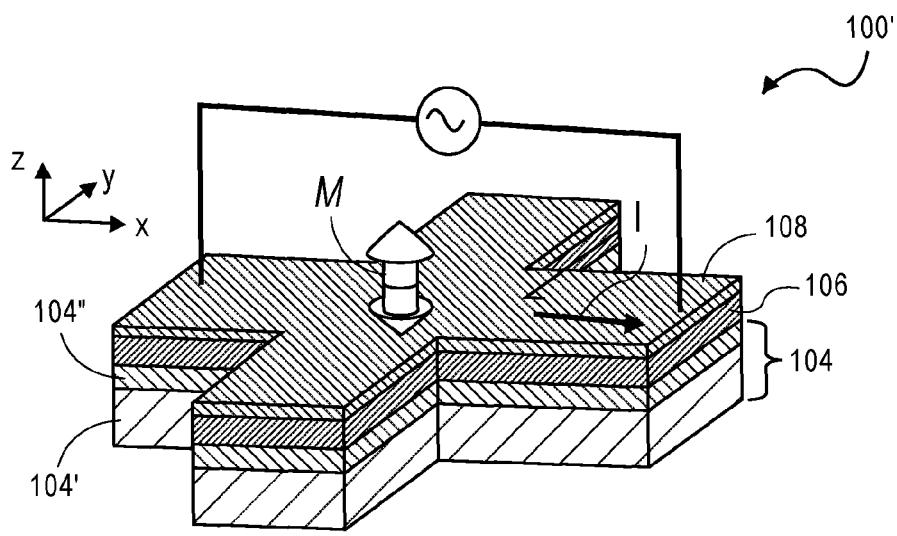
FIG. 3A is a perspective view of a device of an embodiment, such as the device of FIG. 1, but in a Hall-bar configuration and undergoing electric current manipulation of magnetization without a magnetic field.

In an embodiment, a memory-resist device comprising the electric current controllable magnetic structure is formed in a Hall-bar crossing patterning (see FIG. 3A, for example). In such an embodiment, an electric signal output from the bridge is perpendicular to the current channel.

Accordingly, a device 100 of an embodiment as shown in FIG. 1A includes an electric-current-controllable magnetic unit 102 on a substrate 112. The electric unit 102 includes at least one composite heavy-metal layer 104 (e.g., a multilayer of alternating heavy-metal layers) as an electric-current channel, a composite capping layer 108 disposed above the electric-current-channel and at least one ferromagnetic layer 106 disposed between the electric-current channel and the composite capping layer 108.

Accordingly, a device 101 of an embodiment as shown in FIG. 1B includes an electric-current-controllable magnetic unit 102 on a substrate 112. The electric unit 102 includes at least one composite heavy-metal layer 104 as an electric-current channel, a composite capping layer 108 disposed above the electric-current-channel and at least one ferromagnetic layer 106 disposed between the electric-current channel and the composite capping layer 108. The composite capping layer includes a bottom insulting layer 109 and a top heavy-metal layer 110.

A method of producing an electric-current-controllable magnetic unit according to an embodiment of this invention includes forming a composite heavy-metal layer as electric-current channel on a substrate, forming ferromagnetic layer on the composite heavy-metal layer, forming a composite capping layer which may be composed of an insulating layer and a metal layer.

In another embodiment, an electric-current-controllable magnetic tunnel junction (MTJ) according to an embodiment of present disclosure includes an electric-current-controllable magnetic memory unit as the bottom electrode and the first ferromagnetic layer (FM1), an insulating barrier layer (I), and a second ferromagnetic layer (FM2) formed on the insulating layer. The magnetic tunnel junction of FM1/I/FM2 exhibits two resistance states: high resistance when the magnetizations of FM1 and FM2 are antiparallel, low resistance when the magnetizations of FM1 and FM2 are parallel. An electric current passing through the composite heavy metal (composite HM) multilayers causes the magnetization switching of FM1 and alters the magnetic tunnel junction from one resistance state to another resistance state.

In an embodiment, the MTJ comprises an electric current controllable magneto-electronic device. Additionally, the MTJ bay be configured for use as a magnetic random access memory, wherein an electric output is a junction voltage under a small, constant-current, passing junction.

Accordingly, FIG. 2 provides a schematic illustration of an electric-current-controllable magnetic memory device 200 that includes the electric-current-controllable magnetic unit 202 having a tunnel junction and disposed on substrate 212. The electric-current-controllable magnetic unit 202 includes at least one composite heavy-metal layer 204 as an electric-current channel formed on the substrate 212, a capping layer 210 disposed over the composite heavy-metal layer 204 and at least one ferromagnetic layer comprising a first ferromagnetic layer 206 and second ferromagnetic layer 216 disposed over the composite heavy-metal layer. An insulating layer 208 is disposed between the first ferromagnetic layer 206 and the second ferromagnetic layer 216. The magnetic tunnel junction registers high and low resistances when the two (i.e., the first and second) ferromagnetic layers are antiparallel and parallel, respectively. When exposed to an electric-current, an electric-current of tunneling electrons through the insulating layer 208 is greater in a first state of the magnetic tunnel junction tunnel junction and in a second state of the magnetic tunnel junction. An electric-current passing through the electric-current-channel layers made of composite heavy metal multilayer 204 causes the magnetization switching of the first ferromagnetic layer 206 in contact with the charge-current-channel layer. While not limited to any particular theory, it is believed that this magnetization switching gives rise to a large change of resistance in the magnetic tunnel junction, either from low to high or from high to low.

A method of producing an electric-current-controllable magnetic unit according to an embodiment includes forming a composite heavy-metal layer as electric-current channel on a substrate, forming magnetic tunnel junction (FM1/I/FM2) on the composite heavy-metal layer, and forming a capping layer on the MTJ sub-structure.

Substrate

The substrate may comprise a semiconductor, such as Si. In an embodiment, the substrate comprises Si with a native $SiO_2$ layer formed thereon.

Heavy Metals Layer(s)

The composite heavy-metal layer of the embodiments is the source of spin-orbit torque on the at least one ferromagnetic layer in contact with it, as an electric current passes through the channel. In some embodiments, the at least one composite heavy-metal layer 104 and 204, as described above, comprises more than one layer, such as a bilayer layer. In some embodiments, the at least one composite heavy-metal layer comprises a multilayer comprising multiple layers of alternating first and second heavy-metal layers. For ease of presentation, heavy-metal composite multilayers, including bilayers, trilayers, and so on, are depicted as $[X/Y]_n$, where X represents a heavy-metal composition of a first heavy-metal layer, Y represents a heavy-metal composition of a second heavy-metal layer formed on the first heavy metal layer, and n is an integer greater than or equal to 1 to indicate that the arrangement of the first heavy-metal layer and the second heavy metal-layer formed thereon are repeated/stacked so as to provide an alternating multilayer structure of first and second heavy metal layers. In the case of a bilayer, the n may be omitted but is understood to be equal to 1. In some embodiments, the at least one composite heavy-metal layer 104, could comprise only a single layer of heavy-metals.

For example, the at least one composite heavy-metal layer may comprise alternating layers of Pt and W, defining a total multilayer thickness and/or defined by individual thicknesses of each of the alternating layers, for example, multilayer of $[Pt/W]_n$ with appropriate individual thickness. In some embodiments, the at least one composite heavy-metal layer 104 and 204 comprise different kinds of heavy-metal layers having large contrast of spin orbital coupling. While not intending to be limited, exemplary heavy-metals for the at least one composite heavy-metal layer comprise Pt, Pd, Au, Ag, Ru, Ir, Ta, W, Cr, Bi, Mo, Re, Os, Pb, Bi, Tl, alloys thereof or any combination thereof. While not intending to be limited, the alloys may include transition metals, and may comprise such as CuBi, AgBi, CuIr, AgIr, CuW, AgW, CuTa, AgTa, TaAl, as well as some other compounds, e.g., $Nb_3Sn$, $W_3Ge$, TaN, WN, NbN.

In some embodiments, the composite heavy-metal layer 104 and 204 separately have a thickness falling in the range of about 1.0 nm and less than about 8.0 nm. In some embodiments, for example, in which the at least one composite heavy-metal layer has a substructure comprising the multilayer form, the individual heavy-metal layer in the structure have a thickness falling in the range of about 0.2 nm to less than about 4.0 nm.

Ferromagnetic Layer(s)

The ferromagnetic layer in devices of the embodiments may function as the detector of the spin-orbit-torque effect of the composite heavy-metal layer as electric current passes through the channel, and transmits the effect into a measurable electric signal. In some embodiments, the ferromagnetic layer(s) of the embodiments, for example, ferromagnetic layer 106, first ferromagnetic layer 206, and second ferromagnetic layer 216 comprise an ultra-thin $Co_{40}Fe_{40}B_{20}$ film exhibiting PMA. In some embodiments, the first ferromagnetic layer 206 and the second ferromagnetic layer 216 each comprise, for example, $Co_{40}Fe_{40}B_{20}$ film, having an in-plane magnetization. In other embodiments, the at least one ferromagnetic layer 106, the first ferromagnetic layer 206, and the second ferromagnetic layer 216 separately comprise ferromagnets with PMA, including, for example, Co, Fe, CoFeB, CoFeAl, CoMnSi ultra-thin films of $[Co/Pt]_n$, $[Co/Pd]_n$, $[Co/Ni]_n$ multilayers, FePt, CoPt, FePd, TeFeCo, GdCo, MnGa, MnGe, MnSi, alloys thereof, or any combination thereof. In other embodiments, the first ferromagnetic layer 206 and the second ferromagnetic layer 216 each separately comprise ferromagnet with in-plane magnetization, including Co, Fe, CoFeB, NiFe, CoFe, CoFeAl, CoMnSi, or any combination thereof.

In some embodiments, the ferromagnetic layer 106, 206 have a thickness in the range of about 0.7 nm and less than about 5.0 nm, and the second ferromagnetic layer 216 has a thickness of about 0.8 nm and less than about 5.5 nm.

In an embodiment, the ferromagnetic layer 106, 206 may comprise a synthetic antiferromagnetic. In an example, such a material comprises an antiferromagnetically coupled trilayer comprising a first ferromagnet (FM-I), a second ferromagnet (FM-II) and a nonmagnetic metal (NM) disposed between FM-I and FM-II. The antiferromagnetic may be represented by a configuration of FM-I/NM/FM-II and can act as a single ferromagnetic layer. The ferromagnet material that may be selected FM-I and FM-II separately comprises Co, Fe, CoFeB, NiFe, CoFe, CoFeAl, CoMnSi and the nonmagnet metal comprises Ru, Cu, Cr or any combination thereof.

Insulating Layer(s)

The insulating layer, as described above, comprises an electrical insulator. While not limited to any particular theory, it is believed that the insulating layer 208 provides a tunneling potential energy barrier in which electrons pass through by quantum mechanical tunneling to provide a tunneling current. It is further believed that the structure and composition of the tunneling barrier has a large effect of the probability of electron tunneling through the barrier. Accordingly, in an embodiment, the insulating layer 208 comprises MgO, AlO, $HfO_2$, $Ta_2O_5$, or ZrO, or any combination thereof. In one particular embedment, the insulating layer 208 comprises MgO.

In some embodiments, the insulating layer 208 has a thickness of at least about 0.8 nm and less than about 2.0 nm.

Capping Layer

The capping layer 108, 210 as described above may serve to protect the underlying layers and/or may be useful as, for example, a top electrode. Accordingly, the capping layer may comprise an insulating layer, a metal, or both. In an embodiment, the capping layer 108 may also comprise a metallic capping layer. Accordingly, the capping layer may comprise a composite capping layer comprising MgO, $AlO_x$, Ta, or combinations thereof.

In some embodiments, the capping layer 108, 210 has a thickness in the range of at least about 1 nm to about 5 nm.

The composite capping layer 108 as described above may serve as a protecting layer and an additional source of spin-orbit torque. In an embodiment, the composite capping layer 108 comprises a top heavy-metal layer 110 that conducts electrical current and, therefore, generates spin-orbit torque. The top heavy-metal layer 110 is to be selected in accord with the materials used for the composite heavy-metal layer 104, so that the effective spin Hall angles of both layers are of the same sign. In other words, in an embodiment, the top heavy-metal layer 110 may comprise the same heavy-metal as that of composite heavy-metal layer 104. In an embodiment, the top heavy-metal layer 110 comprises a heavy metal than that of heavy metal layer 104. The composite capping layer may comprise a bottom insulating layer 109, comprising MgO, $AlO_x$, TaO, or combinations thereof, and may have a thickness from 0 nm to 3.0 nm.

EXAMPLES

The following examples help explain some concepts of the current invention. The broad concepts of the current invention are not limited to only these particular examples, which are provided for explanation.

Example 1—Magnetic Memory Unit with One PMA Ferromagnetic Layer

Magnetic memory units of the embodiments may comprise various combinations of materials and layer thicknesses. The general structure may be represented as "substrate/composite HM/FM/capping layer". While not intending to be limited to any particular structure, materials or dimensions, various examples 1A-1D are presented below to show specific examples of the magnetic memory units of embodiments.

In these examples, the substrate comprises a Si substrate with a native $SiO_2$ layer ("$Si/SiO_2$-sub"). FM, the ferromagnetic layer, comprises from about 1.0 nm to about 1.4 nm of $Co_{40}Fe_{40}B_{20}$ that exhibit PMA (although, as described above, may also be selected from many other thin magnetic layer materials such as Co). The composite capping layer comprises MgO (about 1.8 nm thickness) or AlOx (about 1.5 nm thickness) and is in contact with the FM layer. Alternatively, in an example, Ta (about 1.0 nm) or numerous other metallic capping layers may be used. Several examples of composite heavy-metal layers for use as electric-current channel of the devices are available. In some of the examples, the composite heavy-metal layers, which function as the electric current channel, comprise bilayers (e.g., 2 layers) and multilayers (e.g, more than two layers, such as a stack comprised of multiple bilayers). In the example of the composite heavy-metal bilayers, a first heavy metal layer comprises Pt and a second heavy metal layer comprises W or Ta. Accordingly, the bilayer may be represented by [Pt/W] or [Pt/Ta]. In the example of the composite heavy-metal multilayer, a first heavy metal layer comprises Pt and a second heavy metal layer comprises W. Accordingly, in the example structures, the multilayer is represented by [Pt/W]n or [W/Pt]n, where n in the examples is 3, although other combinations are possible.

In the [Pt/W] bilayer example, the thickness of the Pt layer is in the range of from about 2.0 nm to about 3.5 nm and the thickness of the W layer is in the range of from about 0.5 nm to about 1.5 nm. In the [Pt/Ta] bilayer example, the thickness of the Pt layer is in the range of from about 2.0 nm to about 3.5 nm and the thickness of the Ta layer is in the range of from about 0.8 nm to about 2.0 nm.

In the $[Pt/W]_3$ multilayer example, the thickness of the Pt layer as the first layer is in the range of from about 0.6 nm to about 1.0 nm and the thickness of the W layer as the second layer is in the range of from about 0.2 nm to about 0.5 nm. In the $[W/Pt]_3$ multilayer example, the thickness of the W layer as the first layer is in the range of from about 1.0 nm to about 2.0 nm and the thickness of the Pt layer as the second layer is in the range of from about 0.2 nm to about 0.5 nm.

Exemplary magnetic memory units can, therefore, be represented as follows:

Example 1A

Si/SiO$_2$-sub/Pt(2.0~3.5 nm)/W(0.5~1.5 nm)/Co$_{40}$Fe$_{40}$B$_{20}$ (1.0~1.4 nm)/MgO(1.8 nm)/Ta(1.0 nm).

Example 1B

Si/SiO$_2$-sub/Pt(2.0~3.5 nm)/Ta(0.8~2.0 nm)/Co$_{40}$Fe$_{40}$B$_{20}$ (1.0~1.4 nm)/MgO(1.8 nm)/Ta(1.0 nm).

Example 1C

Si/SiO$_2$-sub/[Pt(0.6~1.0 nm)/W(0.2~0.5 nm)]$_3$/Co$_{40}$Fe$_{40}$B$_{20}$(1.0~1.4 nm)/MgO(1.8 nm)/Ta(1.0 nm).

Example 1D

Si/SiO$_2$-sub/[W(1.0~2.0 nm)/Pt(0.2~0.5 nm)]$_3$/Co (1.0~1.4 nm)/AlOx(1.5 nm)/Ta(1.0 nm).

Example 2—Magnetic Memory Unit with a Magnetic Tunnel Junction

Magnetic memory units of the embodiments may comprise various combinations of materials and layer thicknesses and includes a tunnel junction. The general structure of such a unit may be represented as "substrate/composite HM/FM1/I/FM2/capping layer". While not intending to be limited to any particular structure, materials or dimensions, various examples 2A-2D are presented below to show specific examples of the magnetic memory units of embodiments.

In these examples, the substrate comprises a Si substrate with a native SiO$_2$ layer ("Si/SiO$_2$-sub"). FM1 and FM2, the ferromagnetic layers of the tunnel junction, can separately comprises from about 0.8 nm to about 1.5 nm of Co$_{40}$Fe$_{40}$B$_{20}$; multilayer structures such as [Co(0.8 nm)/Pt (0.2 nm)]$_2$ or [Co(0.4 nm)/Ni(0.3 nm)]$_3$ multilayers that exhibit PMA; in-plane magnetized Co$_{40}$Fe$_{40}$B$_{20}$ (2.0~3.5 nm); or Co$_{40}$Fe$_{40}$B$_{20}$ (2.0~3.5 nm)/Ru(0.7 nm)/CoFe(2.0 nm) multilayers, although, as described above, each of FM1 and FM2 may also be selected from many other thin magnetic layer materials such as those comprising Co). In the examples 2A-2D, the composite capping layer comprises Ta (about 1.0 nm to about 5.0 nm thickness) or numerous other metallic capping layers may be used. The insulating layer, I, in the examples comprises MgO and a thickness of from about 1 to about 1.2 nm. Several examples of composite heavy-metal layers for use as electric-current channel of the devices are available. In some of the examples, the composite heavy-metal layers, which function as the electric current channel, comprise bilayers (e.g., 2 layers) and multilayers (e.g, more than two layers, such as a stack comprised of multiple bilayers). In the example of the composite heavy-metal bilayers, a first heavy metal layer comprises Pt and a second heavy metal layer comprises W or Ta. Accordingly, the bilayer may be represented by [Pt/W] or [Pt/Ta]. In the example of the composite heavy-metal multilayer, a first heavy metal layer comprises Pt and a second heavy metal layer comprises W. Accordingly, in the example structures, the multilayer is represented by [Pt/W]n or [W/Pt]n, where n in the examples is 3, although other combinations are possible.

In the [Pt/W] bilayer example, the thickness of the Pt layer is in the range of from about 2.0 nm to about 3.5 nm and the thickness of the W layer is in the range of from about 0.5 nm to about 1.5 nm. In the [Pt/Ta] bilayer example, the thickness of the Pt layer is in the range of from about 0.6 nm to about 1.0 nm and the thickness of the Ta layer is in the range of from about 0.3 nm to about 0.5 nm.

In the $[Pt/W]_3$ multilayer example, the thickness of the Pt layer as the first layer is in the range of from about 0.6 nm to about 1.0 nm and the thickness of the W layer as the second layer is in the range of from about 0.2 nm to about 0.5 nm. In the $[W/Pt]_3$ multilayer example, the thickness of the W layer as the first layer is in the range of from about 1.2 nm to about 2.0 nm and the thickness of the Pt layer as the second layer is in the range of from about 0.2 nm to about 0.5 nm.

Exemplary magnetic memory units can, therefore, be represented as follows:

Example 2A

Si/SiO$_2$-sub/Pt(2.0~3.5 nm)/W(0.5~1.5 nm)/Co$_{40}$Fe$_{40}$B$_{20}$ (1.0~1.2 nm)/MgO(1.0 nm)/CoFeB(1.2~1.4 nm)/Ta(5.0 nm), where Pt/W is the composite heavy-metal electric current channel, Co$_{40}$Fe$_{40}$B$_{20}$ (1.0~1.2 nm) exhibiting PMA is the first ferromagnetic layer, MgO and Ta form the composite capping layer, CoFeB(1.2~1.4 nm) exhibiting PMA is the second ferromagnetic layer.

Example 2B

Si/SiO$_2$-sub/[Pt(0.6~1.0 nm)/Ta(0.3~0.5 nm)]$_3$/Co$_{40}$Fe$_{40}$B$_{20}$ (1.0~1.2 nm)/MgO(1.0 nm)/CoFeB(1.2~1.4 nm)/Ta(5.0 nm), where [Pt(0.6~1.0 nm)/Ta(0.3~0.5 nm)]$_3$ is the composite heavy-metal electric current channel, Co$_{40}$Fe$_{40}$B$_{20}$ (1.0~1.2 nm) exhibiting PMA is the first ferromagnetic layer, MgO is the insulating layer, CoFeB (1.2~1.4 nm) exhibiting PMA is the second ferromagnetic layer, Ta is the capping layer.

Example 2C

Si/SiO$_2$-sub/[W(1.2~2.0 nm)/Pt(0.2~0.5 nm)]$_3$/[Co(0.4 nm)/Ni(0.3 nm)]$_3$/MgO(1.2 nm)/[Co(0.8 nm)/Pt(0.2 nm)]$_2$/Ta(5.0 nm), where [W(1.2~2.0 nm)/Pt(0.2~0.5 nm)]$_3$ is the composite heavy-metal electric current channel, [Co(0.4 nm)/Ni(0.3 nm)]$_3$ exhibiting PMA is the first ferromagnetic layer, MgO is the insulating layer, [Co(0.8 nm)/Pt(0.2 nm)]$_2$ exhibiting PMA is the second ferromagnetic layer, Ta is the capping layer.

Example 2D

Si/SiO$_2$-sub/Pt(2.0~3.5 nm)/W(0.5~1.5 nm)/Co$_{40}$Fe$_{40}$B$_{20}$ (2.0~3.5 nm)/MgO(1.0 nm)/CoFeB(2.0~2.5 nm)/Ru(0.6 nm)/CoFe(3.0 nm)/Ta(5.0 nm), where Pt/W is the composite heavy-metal electric current channel, Co$_{40}$Fe$_{40}$B$_{20}$ (2.0~3.5 nm) is the first ferromagnetic layer, MgO is the insulating layer, CoFeB(2.0~2.5 nm)/Ru(0.6 nm)/CoFe(3.0 nm) is the second ferromagnetic layer with a synthetic antiferromagnetic structure, Ta is the capping layer.

Additional Examples

Ferromagnetic thin films with perpendicular magnetic anisotropy (PMA) are basic units used in spintronic devices such as in MTJs. The effect of the spin-orbit torque on thin FM sandwiched between a heavy-metal structure and an insulating layer is dominated by the interface of FM and HM structure, and the magnetization direction is easily detected using the Anomalous Hall effect (AHE), thus a ultra-thin CoFeB film with PMA is a good candidate for demonstration. In the following examples, the electric current effect in 1.0 nm CoFeB film are demonstrated, where the perpendicular magnetic anisotropy (PMA) originates from the CoFeB/MgO interfaces. The electric current channel is Pt/W bilayer and [Pt/W]n multilayer structure, in which Pt and W have opposite spin Hall angle.

The structure of the electric current manipulated magnetic unit is Si/SiO$_2$/Pt(1.5~4.5 nm)/W(0.7~0.8 nm)/Co$_{40}$Fe$_{40}$B$_{20}$ (1.0 nm)/MgO(1.8 nm)/Ta(1 nm), where the essential part is Pt/W/CoFeB/MgO with a schematic shown in FIG. 3A.

Example 3—Electric Current Manipulation of Magnetization without a Magnetic Field Hall-bar devices having different thicknesses of heavy-metal layers were constructed according to an exemplary embodiment and exposed to different electric currents supplied by a current source. One such hall bar device 100', as shown in FIG. 3A, includes a heavy-metal composite layer 104 as a charge channel comprising a first heavy metal layer 104' and a second heavy metal layer 104", a ferromagnetic layer 106 and a capping layer 108. An exemplary device structure comprised Pt/W/CoFeB/MgO for first heavy metal layer 104'/second heavy metal layer 104"/ferromagnetic layer 106/capping layer 108. The different films were deposited in a multi-source UHV magnetron sputtering system with the base vacuum of 6×10$^{-9}$ Torr. A post thermal treatment was then carried out in vacuum at 300° C. for 20 min to obtain the PMA of CoFeB film. The first heavy metal layer 104' had a thickness of 3.1 nm. The second heavy metal layer was varied across three devices with a first thickness of 0.9 nm in a first device, 1.1 nm in a second device and 1.3 nm in a third device. The ferromagnetic layer in the devices was 1.0 nm. And the capping layer in the devices was 1.8 nm.

Figure 3B:
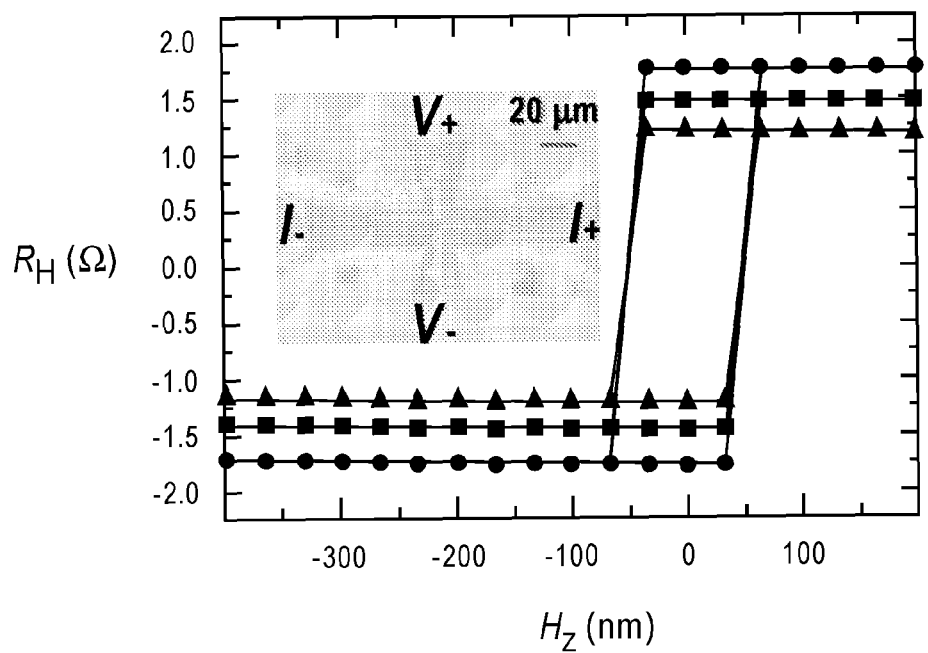
FIG. 3B is a graph showing results of anomalous Hall resistance R(H) measurements of Hall-bar devices of FIG. 3A at different heavy-metal layer thicknesses.

The device was exposed to an electric current supplied by a current source and the current passed through the charge channel to manipulate magnetization M. Specifically, the Hall bar devices having configuration as in FIG. 3A (and shown in FIG. 3B inset) with width of 20 mm were fabricated and measured at room temperature. The PMA of the sample was confirmed by testing the AHE with magnetic field applied in perpendicular direction (H$_z$). The clear switching of AHE loops of the samples of Pt(3.1)/W(0.9, 1.1, 1.3)/CoFeB/MgO in FIG. 3B with switching field of 50 Oe indicates a well-formed PMA of CoFeB films. In the testing configuration shown in the inset of FIG. 3B, the positive and negative resistance values represent the local magnetization direction is up and down, respectively. As W layer thickness increases from 0.9 to 1.3 nm, the Hall resistance (R$_H$) of the samples decreases from 1.6 to 1.1Ω, due to the decrease of the resistance of the film. FIG. 3B shows resulting anomalous Hall resistance R(H) curves for the Hall-bar device 100' exposed to a first electrical current.

Figure 3C:
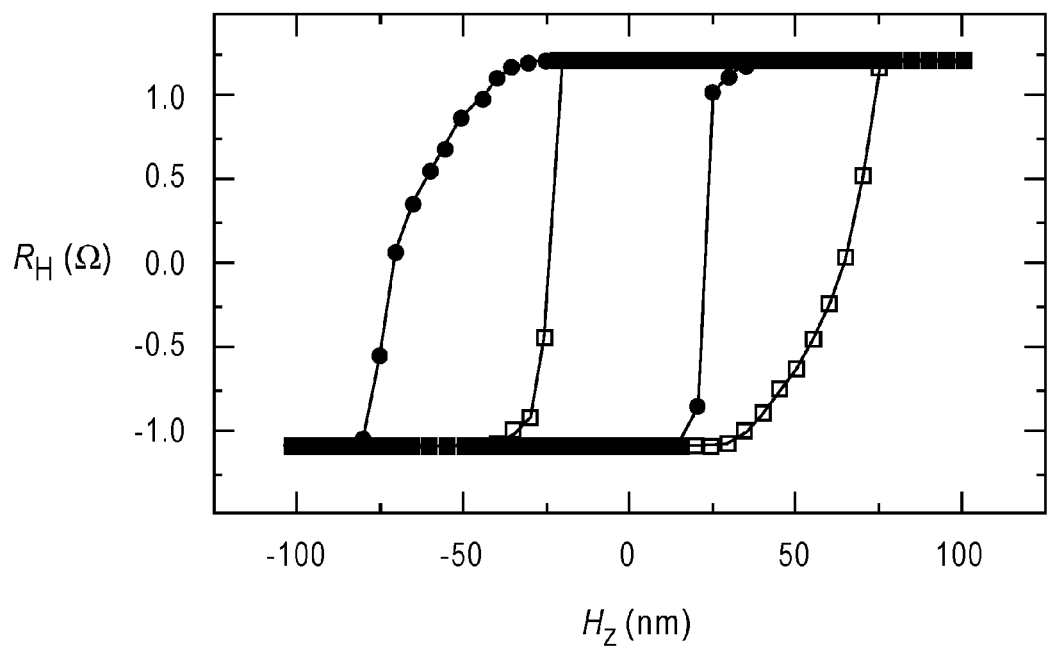
FIG. 3C is a graph showing results of anomalous Hall resistance R(H) measurements of Hall-bar devices of FIG. 3A under different electric currents.

FIG. 3C shows resulting anomalous Hall resistance R(H) curves for the Hall-bar device 100' exposed to a second, different electrical current than that for the results in FIG. 3B. The effect of the electric current on the switching curve of the CoFeB in these devices is presented in FIG. 3C. As the current increases, the AHE loop exhibits a shift, with the bias direction dependent on the current direction, as shown in FIG. 1c for Pt(3.1 nm)/W(1.1 nm)/CoFeB/MgO. The left and right shift with step of 28 Oe were exhibited when the testing current were +4 and −4 mA. The effective field here under 4 mA can be calculated as $[(H_+ - H_-)_{4\ mA} - (H_+ - H_-)_{-4\ mA}]/2$, which is 56 Oe, normalized by the effective current density defined as the current I divided by the bridge cross-section area, the current induced effective perpendicular field (H$_\perp$) per unit area is H$_\perp$/J$_c$ of 80 Oe/10$^{11}$ A/m$^2$.

Figure 4:
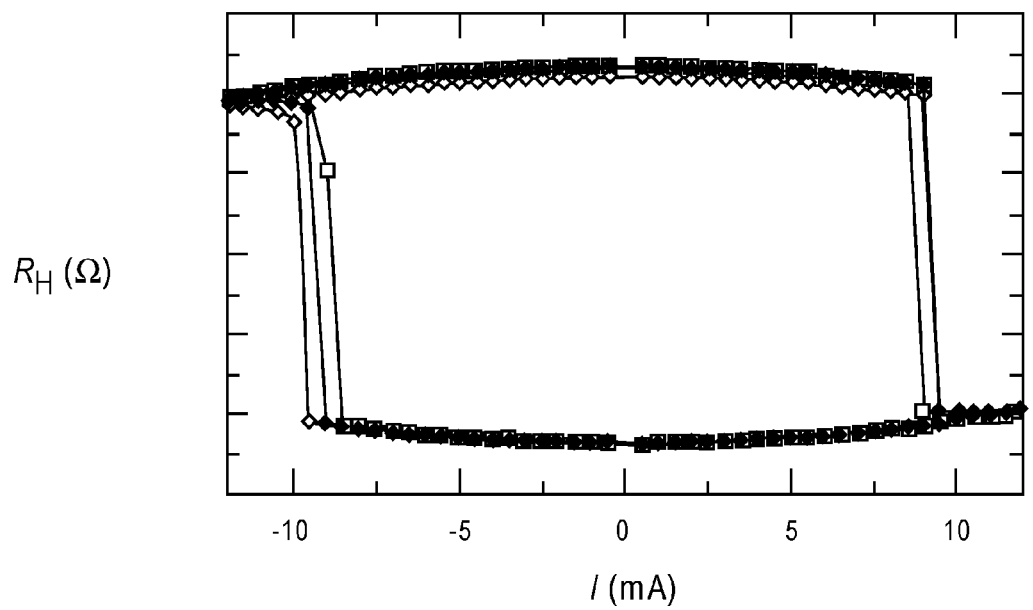
FIG. 4 is a graph showing results of manipulation of magnetization by an electric current of a device of an embodiment.

Example 4—Electric Current Manipulation of Magnetization without a Magnetic Field The electric-current induced magnetization switch of the Pt(3.1 nm)/W(1.1 nm)/CoFeB device with magnetic field applied at one current direction is shown in FIG. 4. The R(I) curve tested with H$_x$ of −70, 70, 0 Oe are presented in the figure with open-diamond, open-square, and solid-square, respectively. In the usual spin Hall switching with single HM layer, the switching direction is dependent on the magnetic field direction, and the critical current (I$_c$) decreases as the strength of the magnetic field increases, and the magnetization cannot be switched by current alone without the magnetic field in such usual Hall bar devices with homogeneous film. Here the switching direction is independent on H$_x$, and the deterministic magnetization switch is achieved when H$_x$ is zero.

Example 5—Effects of Heavy Metal Layer Thickness on Switching Current and Effective Perpendicular Magnetic Field Caused by Spin Orbital Torque (SOT)

To demonstrate the thickness selection of Pt and W layers, two series of the sample device, but with variation of W and Pt thicknesses were fabricated. Device structures had the following configurations:

Devices with thickness variations of the second heavy metal layer comprising W ("W series devices): Pt(3.1 nm)/W(0.7~1.5 nm)/CoFeB(1.0 nm)/MgO(1.8 nm)/Ta(1.0 nm); and Devices in which thickness variations for the first heavy metal layer comprising P ("P series devices): Pt(1.5~4.5 nm)/W(1.1 nm)/CoFeB(1.0 nm)/MgO(1.8 nm)/Ta(1.0 nm)

Figure 5A:
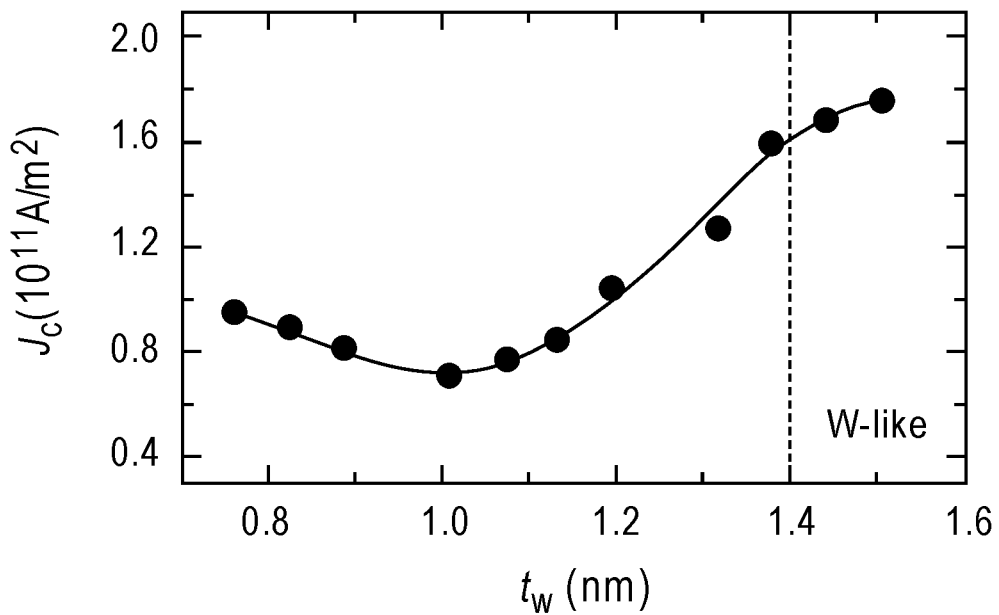
FIGS. 5A-5D are graphs showing results of experiments illustrating the effects of changing the thickness of different layers of the composite heavy-metal multilayer of a device of the embodiments on switching current and effective perpendicular magnetic field caused by spin orbital torque.

The zero-field switch of the magnetization was achieved in an appropriate range of W and Pt thickness. The W and Pt thickness dependence of the switch on series W and Pt are plotted in FIGS. 5A and 5B. With fixed Pt of 3.1 nm, the samples with W thickness range from 0.75 to 1.4 nm could be switched by current without the need of a magnetic field, and the effective critical current density Jc shows a minimum value when $t_w$ is around 1.0 nm (FIG. 5A). As the $t_w$ increases to 1.45 nm, the sample could not be switched by current alone, and the switching behavior is similar to that for W/CoFeB/MgO sample, where the switching curves with Hx of +70 and −70 Oe, are shown in FIG. 5C with open and solid dots, respectively. The switching direction is dependent on field direction, corresponding to the left-charity of domain wall and negative spin Hall angle of W.

Figure 5B:
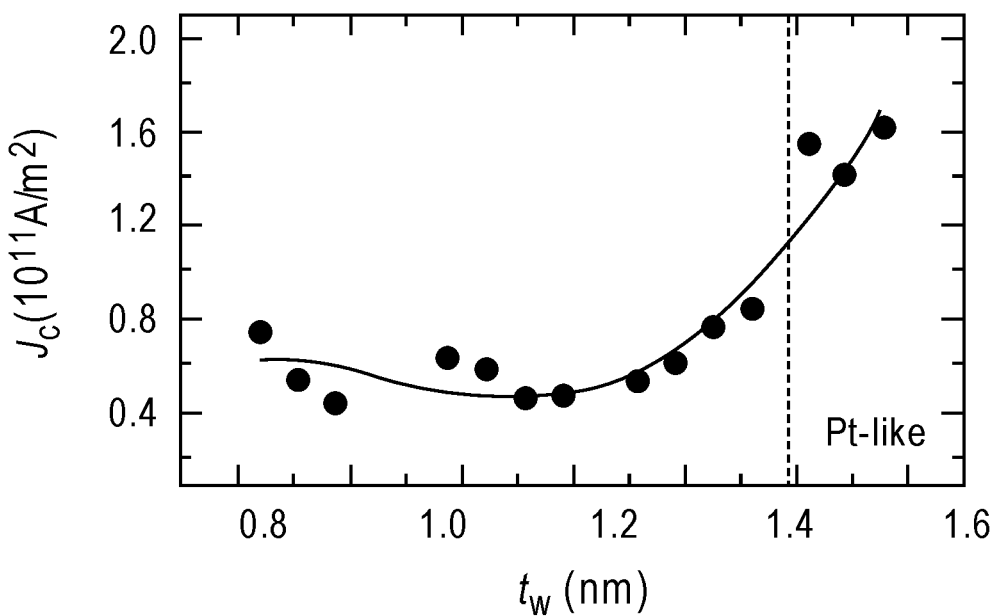
Figure 5C:
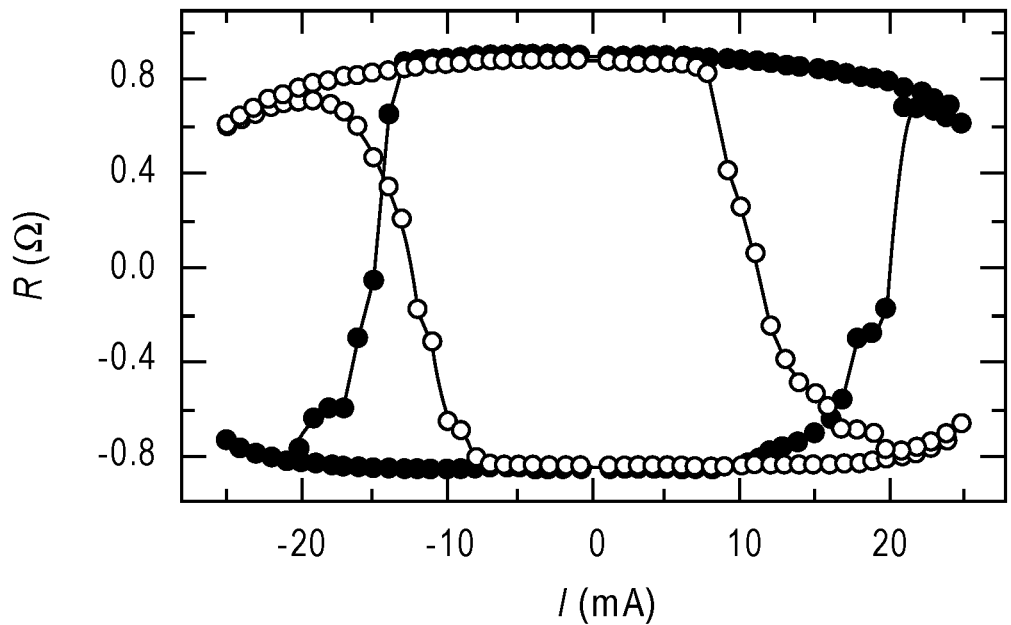
Figure 5D:
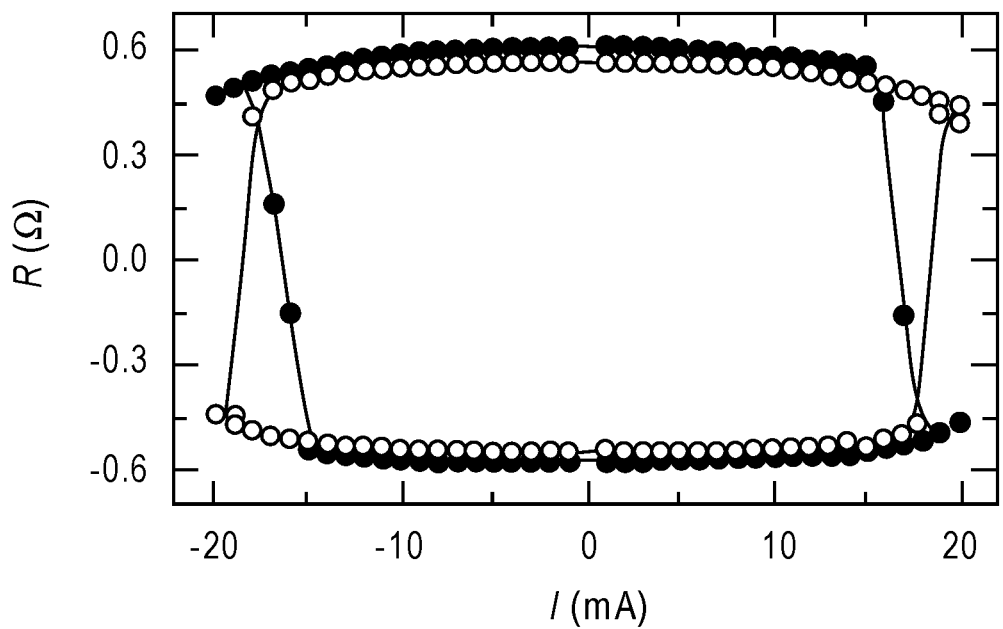
Figure 8:
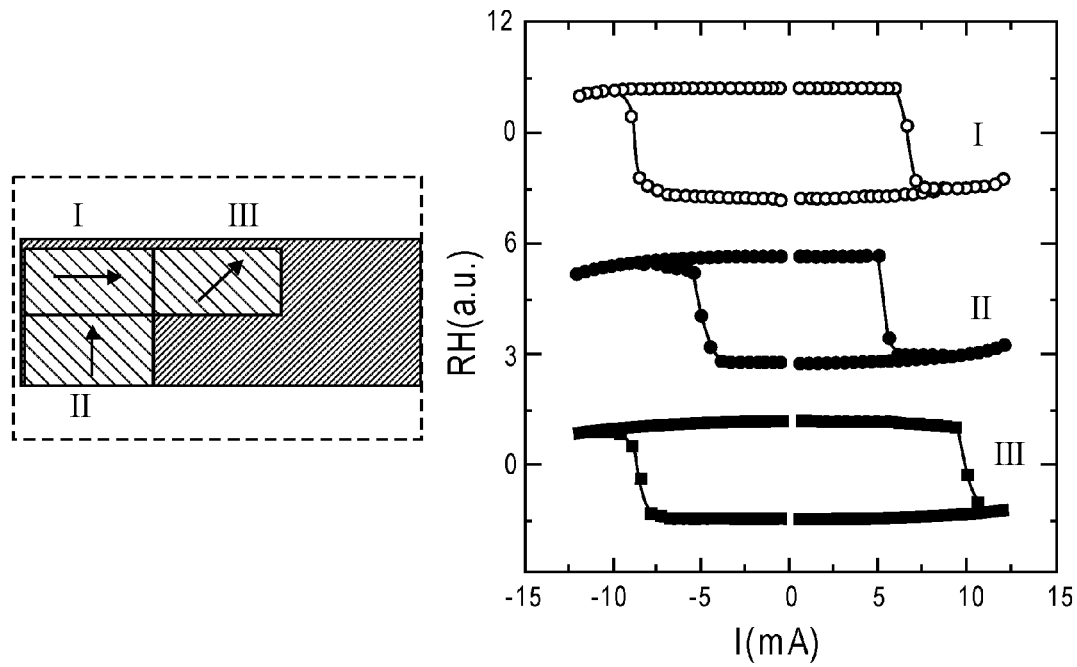
FIG. 8 shows hall bars having an electric-current bridge in different directions and a corresponding graph showing switching of the magnetization observed in each of the hall bars.

Samples with a fixed W thickness of 1.1 nm, with Pt thickness range from 1.5 to 4.0 nm could be switched by current without requiring a magnetic field, and the effective critical current density Jc shows a minimum value when $t_{Pt}$ is around 3.0 nm (FIG. 5B). For the sample with Pt thickness larger than 4.0 nm, the switching type was similar to that of the Pt/CoFeB/MgO sample, as shown in FIG. 8, where the switching curves with Hx of +70 and −70 Oe, are shown in FIG. 5D with open and solid dots, respectively.

While the present teachings have been illustrated with respect to one or more implementations, alterations and/or modifications may be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages may be added or existing structural components and/or processing stages may be removed or modified.

Figure 6A:
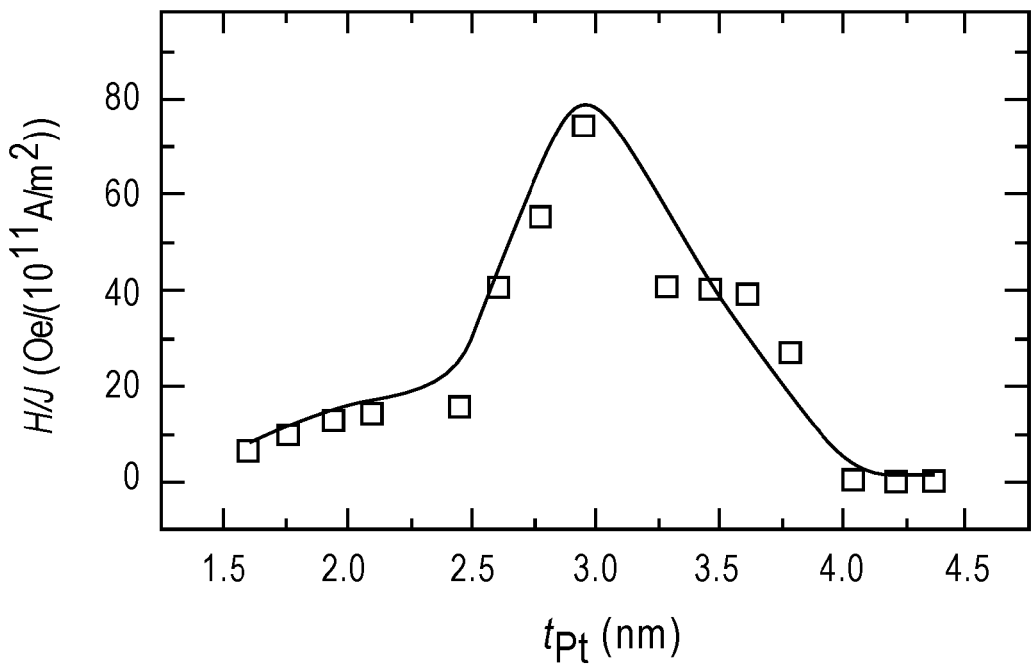
FIGS. 6A-6B are graphs showing results of experiments illustrating the effects of thickness of the different layers of a composite heavy-metal multilayer of the embodiments on the effective perpendicular magnetic field caused by the spin orbital torque (SOT).
Figure 6B:
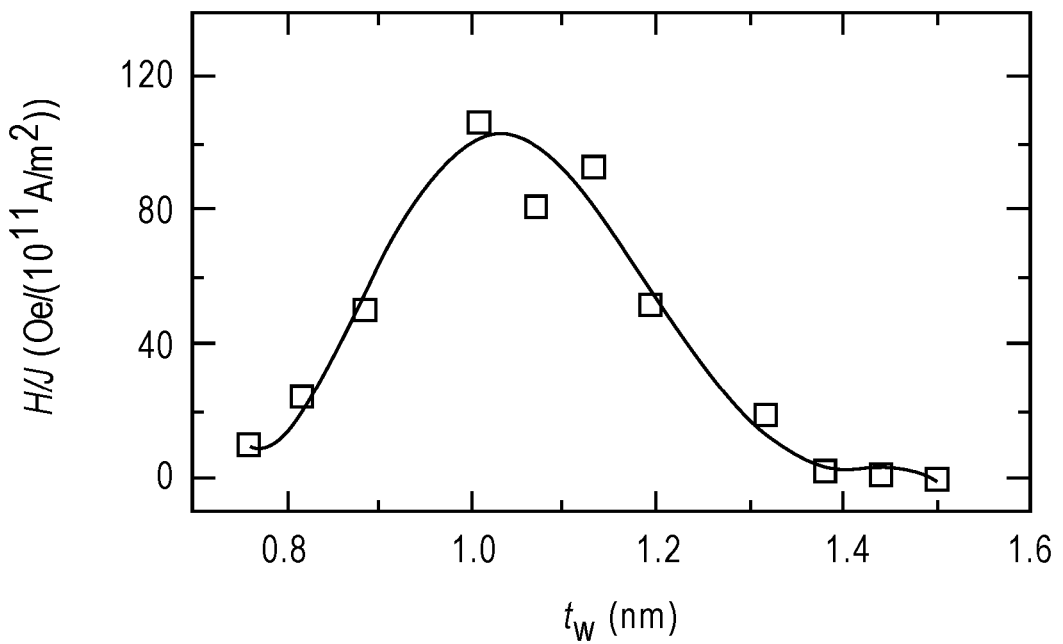
Figure 7:
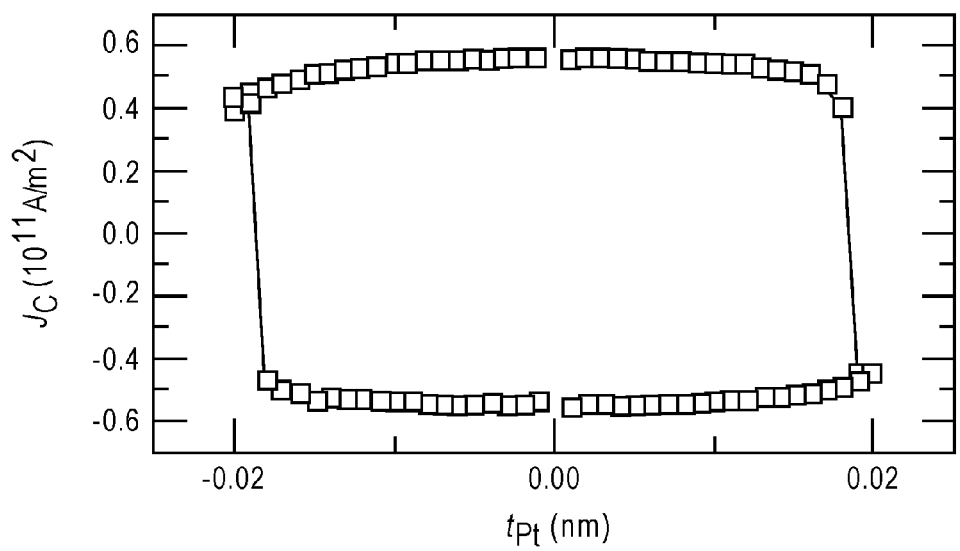
FIG. 7 is a graph showing an example of electric-current-induced unipolar switching according to an exemplary embodiment.

Example 6—Effect of Current on Perpendicular Magnetization of Ferromagnetic Layer To analyze the effect of the current on the perpendicular magnetization of CoFeB, the $H_{eff}/Jc$ for two series was observed by testing the AHE loops under different current values. In both cases, a peak appears in certain $t_w$ and $t_{Pt}$ as shown in FIGS. 6A and 6B, respectively. As the $H_{eff}/J_c$ was reduced to zero, current alone could not switch the magnetization, whereas with increasing $H_{eff}/J_c$ values, current switching became more efficient, as indicated by the reducing values of $J_c$ as shown in FIG. 7.

To remove the possibility of switching caused by the non-uniformity as reported in the literature, Hall bars were fabricated in different directions (marked with I, II, III). The switching of the magnetization was observed, and independent on the patterning direction, as shown in the results of FIG. 8. This further confirmed the magnetization switching originates from the unique design of the composite heavy-metal layer of the devices of the embodiments.

Example 7—Sample Device Fabrication

The electric current controllable magnetic units of the examples were fabricated using a 10-source UHV magnetron sputtering system. Some of the structures that were studied comprised Si/SiO$_2$-sub/Pt(1.5~4.5 nm)/W(0.7~1.5 nm)/Co$_{40}$Fe$_{40}$B$_{20}$(1.0 nm)/MgO(1.8 nm)/Ta(1 nm).

The base pressure of the sputtering chamber was $3 \times 10^{-9}$ Torr. All the metal layers were deposited by DC sputtering under a pressure of 2 mTorr. The MgO layer was deposited by RF sputtering under a pressure of 1.0 mTorr. The deposition rate of MgO layer was about 0.22 Å/s. One of the critical conditions in achieving good perpendicular magnetized CoFeB is to form the β phase W. Accordingly, an ultra-low power was used for the W deposition to get the β phase. The Hall bar devices with the charge-current-channel bridge width of 20 μm were fabricated using ultra-violet photolithography after the disposition of multilayers. The fully patterned devices were then annealed for 1 hour in a thermal annealing system in vacuum under the perpendicular field of 4 kOe.

Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items may be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

Furthermore, to the extent that the terms "including", "includes", "having", "has", "with", or variants thereof are used in either the detailed description and the claims, such terms are intended to be inclusive in a manner similar to the term "comprising." As used herein, the phrase "one or more of", for example, A, B, and C means any of the following:

either A, B, or C alone; or combinations of two, such as A and B, B and C, and A and C; or combinations of three A, B and C.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An electric-current-controllable magnetic unit, comprising:
a substrate,
an electric-current channel disposed on the substrate, the electric-current channel comprising a composite heavy-metal multilayer comprising at least one heavy-metal, wherein the composite heavy-metal multilayer comprises an alternating first layer and second layer, wherein the first layer comprises a first heavy metal and the second layer comprises a second heavy metal that is different than the first heavy metal;
a capping layer disposed over the electric-current channel; and
at least one ferromagnetic layer disposed between the electric-current channel and the capping layer.

2. The electric-current-controllable magnetic unit of claim 1, wherein the electric-current channel, the capping layer and the ferromagnetic layer are configured such that a magnetization direction thereof changes when an electric current is passed through the electric-current channel.

3. The electric-current-controllable magnetic unit of claim 1, wherein the at least one heavy-metal comprises Pt, Pd, Au, Ag, Ru, Ir, Ta, W, Cr, Bi, Mo, Re, Os, Pb, Bi TI, combinations thereof, or alloys thereof.

4. The electric-current-controllable magnetic unit of claim 3, wherein the alloys thereof comprise CuBi, AgBi, CuIr, AgIr, CuW, AgW, CuTa, AgTa, TaAl, Nb$_3$Sn, W3Ge, TaN, WN, NbN or combinations thereof.

5. The electric-current-controllable magnetic unit of claim 1, wherein the electric-current channel comprises a thickness in the range of from about 1.0 nm to less than about 8.0 nm.

6. The electric-current-controllable magnetic unit of claim 1, wherein a ferromagnet of the at least one ferromagnetic layer comprises an in-plane magnetized ferromagnet, a perpendicular-magnetized ferromagnet, or both.

7. The electric-current-controllable magnetic unit of claim 6, wherein the in-plane magnetized ferromagnet comprises Co, Fe, CoFeB, NiFe, CoFe, CoFeAl, CoMnSi, or any combination thereof.

8. The electric-current-controllable magnetic unit of claim 6, wherein the perpendicular magnetized ferromagnet comprises Co, Fe, CoFeB, CoFeAl, CoMnSi; [Co/Pt]$_n$, [Co/Pd]$_n$, [Co/Ni]$_n$, FePt, CoPt, FePd, TeFeCo, GdCo, MnGa, MnGe, MnSi, alloys thereof, or any combination thereof.

9. The electric-current-controllable magnetic unit of claim 1, wherein the at least one ferromagnetic layer comprises an antiferromagnetic sub-structure comprising a first ferromagnet (FM-I), a second ferromagnet (FM-II) and a nonmagnetic material disposed between FM-I and FM-II.

10. The electric-current-controllable magnetic unit of claim 9, wherein the nonmagnetic material comprises Ru, Cu, Cr or any combination thereof.

11. The electric-current-controllable magnetic unit of claim 1, further comprising a magnetic tunnel junction comprising the at least one ferromagnetic layer and an insulating layer, wherein the at least one ferromagnetic layer comprises a first ferromagnetic layer and a second ferromagnetic layer, and wherein the insulating layer is disposed between the first insulating layer and the second insulating layer.

12. The electric-current-controllable magnetic unit of claim 11, wherein the first ferromagnetic layer comprises a first magnetic coercive field, wherein the second ferromagnetic layer comprises a second magnetic coercive field, wherein the first and second magnetic coercive fields are alignable substantially parallel to each other in a first state of the magnetic tunnel junction and are alignable substantially antiparallel in a second state of the magnetic tunnel junction.

13. The electric-current-controllable magnetic unit of claim 12, wherein the electric-current channel, the capping layer and the ferromagnetic layer are configured such that an electric-current of tunneling electrons through the insulating layer is greater in the first state than in the second state.

14. The electric-current-controllable magnetic unit of claim 11, wherein the insulating layer comprises MgO, AlO, HfO$_2$, Ta$_2$O$_5$, ZrO, or any combination thereof.

15. An electric-current-controllable magnetic unit, comprising:
a substrate,
an electric-current channel disposed on the substrate, the electric-current channel comprising a composite heavy-metal multilayer comprising at least one heavy-metal, wherein the at least one heavy-metal comprises a spin Hall angle;
at least one ferromagnetic layer disposed on the electric-current channel
a capping insulator layer disposed on the ferromagnetic layer; and
a top heavy-metal layer disposed on the capping insulator layer,
wherein the top heavy-metal layer comprises at least one layer of a heavy-metal that comprises a spin Hall angle of the same sign as that of the composite heavy-metal multilayer.

16. The electric-current-controllable magnetic unit of claim 15, wherein the at least one heavy-metal comprises Pt, Pd, Au, Ag, Ru, Ir, Ta, W, Cr, Bi, Mo, Re, Os, Pb, Bi TI, combinations thereof, or alloys thereof.

17. A method of operating an electric-current-controllable magnetic unit, comprising
supplying an electric current to an electric-current-controllable magnetic unit, wherein the electric-current-controllable magnetic unit comprises:
a substrate,
an electric-current channel disposed on the substrate, the electric-current channel comprising a composite heavy-metal multilayer comprising at least one heavy-metal,
wherein the composite heavy-metal multilayer comprises an alternating first layer and second layer,
wherein the first layer comprises a first heavy metal and the second layer comprises a second heavy metal that is different than the first heavy metal;
a capping layer disposed over the electric-current channel; and
at least one ferromagnetic layer disposed between the electric-current channel and the capping layer; and
changing a magnetization direction of the electric-current-controllable magnetic unit,
wherein the electric current passes through the composite heavy-metal layer.

18. The method of claim 17, wherein the electric-current-controllable magnetic unit comprises a magnetic tunnel junction comprising the at least one ferromagnetic layer and an insulating layer, wherein the at least one ferromagnetic layer comprises a first ferromagnetic layer and a second ferromagnetic layer, and wherein the insulating layer is disposed between the first ferromagnetic layer and the second ferromagnetic layer.

19. The method of claim 18, wherein the first ferromagnetic layer comprises a first magnetic coercive field, wherein the second ferromagnetic layer comprises a second magnetic coercive field, and wherein the first and second magnetic coercive fields are alignable substantially parallel to each other in a first state of the magnetic tunnel junction and are alignable substantially antiparallel in a second state of the magnetic tunnel junction.

20. The method of claim 19, wherein the method further comprises switching magnetization of the first ferromagnetic layer from one of the first and second states to the other of the first and second states.

\* \* \* \* \*